United States Patent [19]

Kamiya

[11] Patent Number: 5,621,311
[45] Date of Patent: Apr. 15, 1997

[54] DIGITAL MULTIMETER HAVING AN IMPROVED ENCLOSURE

[75] Inventor: Manabu Kamiya, Suwa, Japan

[73] Assignee: Seiko Epson Corporation, Tokyo, Japan

[21] Appl. No.: 384,007

[22] Filed: Feb. 6, 1995

[30] Foreign Application Priority Data

Apr. 1, 1994 [JP] Japan ................................. 6-065216

[51] Int. Cl.$^6$ ............................ G01R 1/04; G01D 11/24; H05K 5/00
[52] U.S. Cl. .................. 324/156; 174/52.3; 220/4.02; 220/614; 324/99 D; 324/115
[58] Field of Search .......................... 324/99 D, 110, 324/115, 149, 156, 157; 220/4.02, 213, 214, 221, 222, 310, 357, 358, 614, 681; 174/52.1, 52.3, 52.4; 361/659, 660, 668, 672, 679–681, 730, 752

[56] References Cited

U.S. PATENT DOCUMENTS

| | | | |
|---|---|---|---|
| 2,852,154 | 9/1958 | Brown | 220/4.02 |
| 3,685,682 | 8/1972 | Frey, III | 220/614 X |
| 3,924,185 | 12/1975 | Schwartz | 324/115 |
| 4,176,315 | 11/1979 | Sunnarborg | 324/156 |
| 4,951,834 | 8/1990 | Aikins | 220/614 |
| 5,140,259 | 8/1992 | Aida | 324/156 |

FOREIGN PATENT DOCUMENTS

| | | | |
|---|---|---|---|
| 2734033 | 2/1979 | Germany | 324/156 |
| 3933644 | 4/1991 | Germany | 324/156 |
| 146047 | 11/1980 | Japan | 324/156 |
| 82479 | 3/1994 | Japan | 324/156 |

OTHER PUBLICATIONS

Nihon Keizai Shinbun (Japan Economic News) of Feb. 8, 1994.
Nikkan Kogyo Shinbun (Daily Industrial News) of Feb. 16, 1994.
Catalog (unknown date of issue, receiving stamp on Feb. 7, 1994).

Primary Examiner—Gerard R. Strecker
Attorney, Agent, or Firm—Oliff & Berridge

[57] ABSTRACT

A digital multimeter is provided with a highly reliable seal at a connection interface between an upper and lower enclosure forming an enclosure. The multimeter also has a highly reliable seal at peripheral boundaries of operating elements disposed on a surface of the enclosure thereby providing a highly-reliable, water-proof and dust-proof mechanism at a low cost. A packing serves as an elastic sealing material and is disposed at the connection interface between the upper enclosure and the lower enclosure. The packing is pressed and crushed in a slant direction relative to the direction of the thickness of the enclosure thereby providing a sealing mechanism at the connection interface. The periphery of a rubber key serving as an operating element is sealed by a double sealing mechanism comprising an uneven face formed on a peripheral side and an even face formed on the upper enclosure. The periphery of a rotary switch is sealed by a sealing mechanism including an O-ring pressed in a direction perpendicular to the thickness of the enclosure. Thus, the invention provides a simple sealing mechanism for a digital multimeter which provides excellent protection from water and dust.

11 Claims, 8 Drawing Sheets

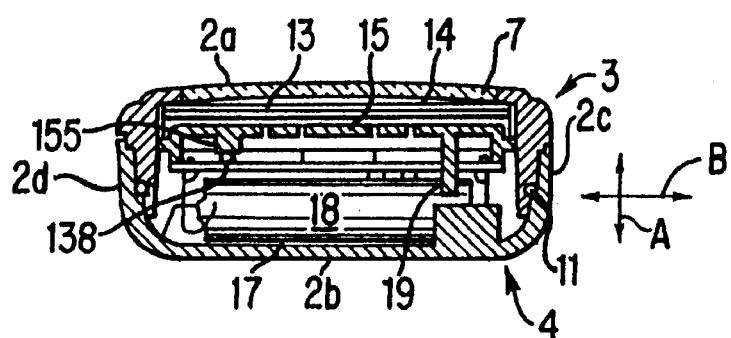
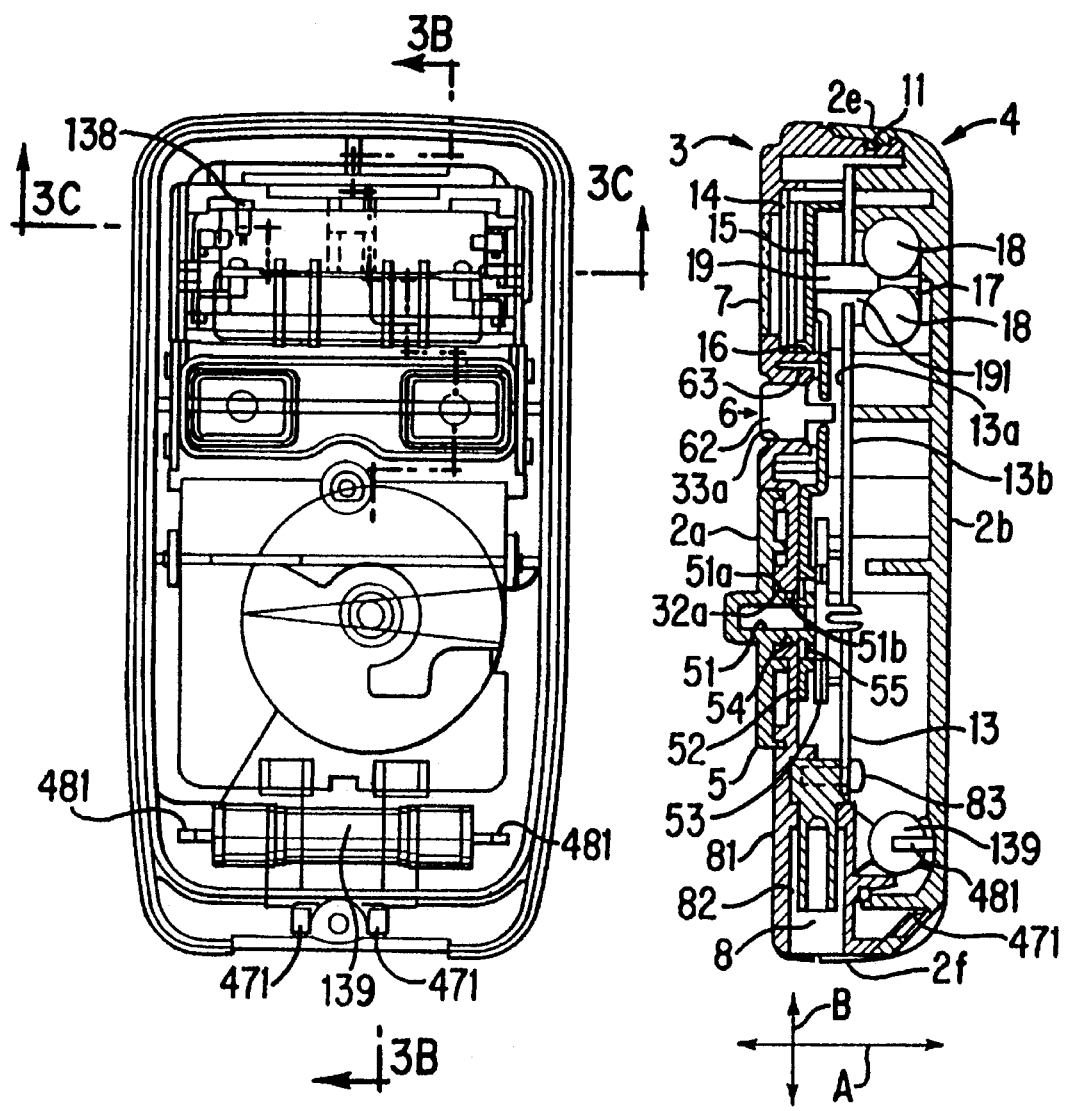
FIG. 3C
FIG. 3A
FIG. 3B

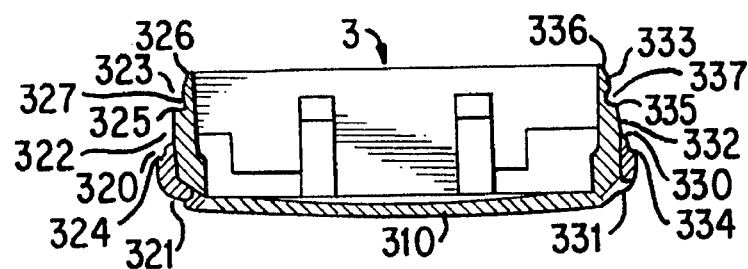
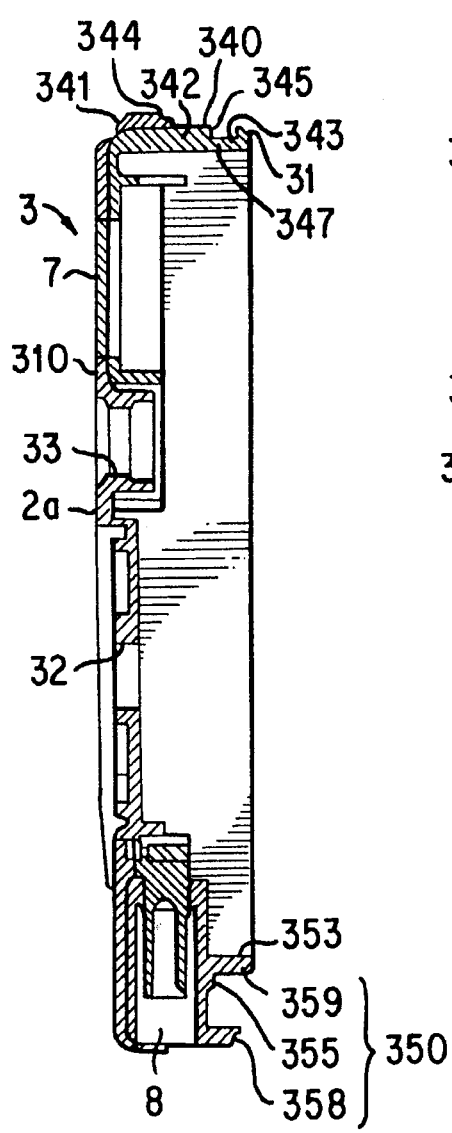
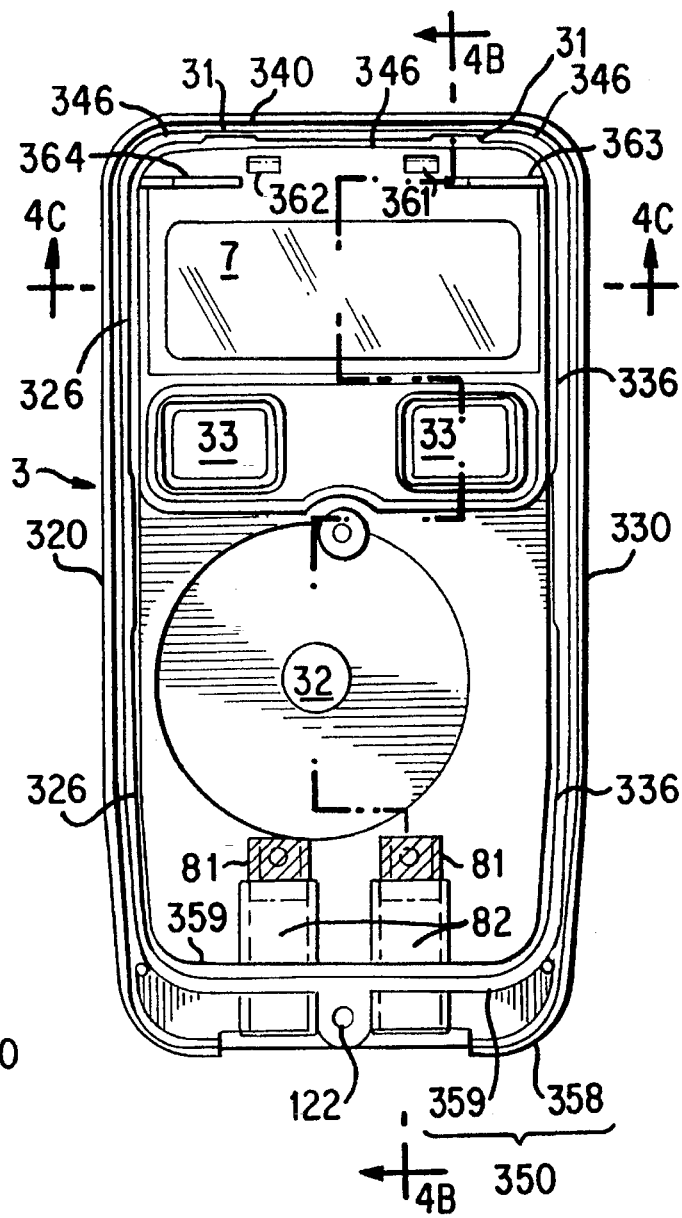
FIG. 4C
FIG. 4B
FIG. 4A

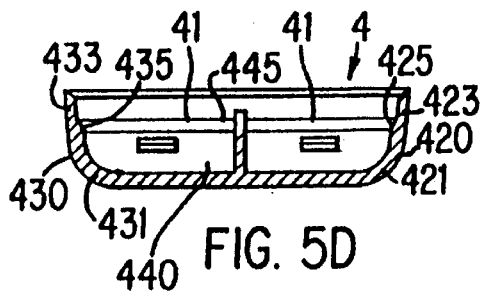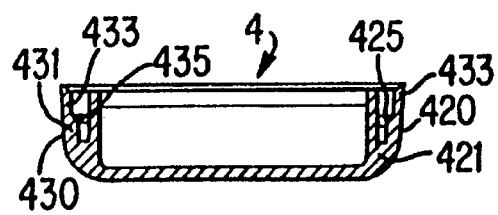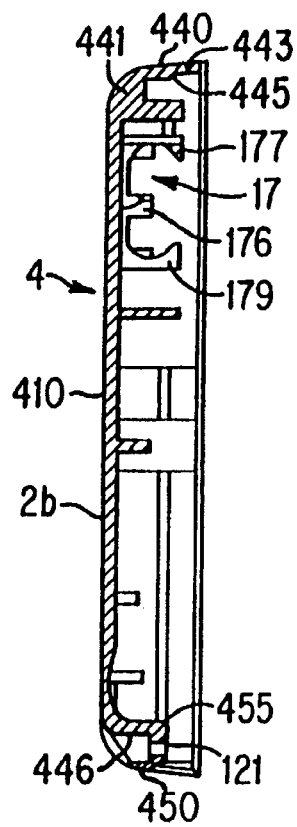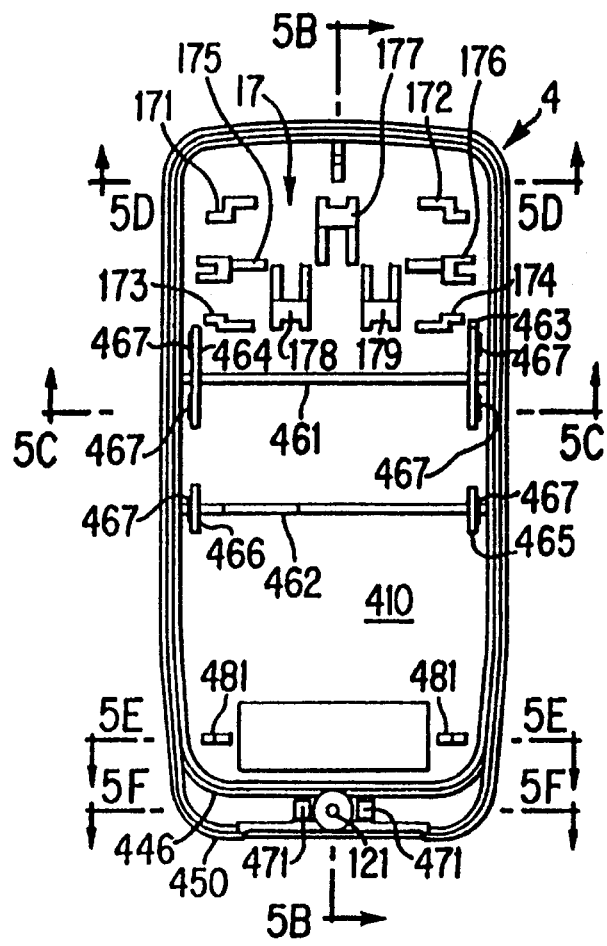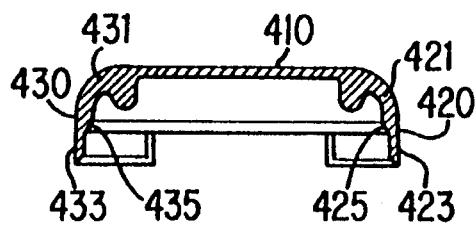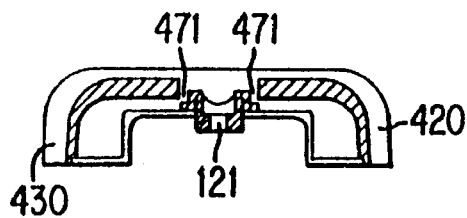

DIGITAL MULTIMETER HAVING AN IMPROVED ENCLOSURE

BACKGROUND OF THE INVENTION

1. Field of the Invention

The present invention relates to a digital multimeter for measuring current, voltage, etc., and particularly to an improvement in its water proof and dust proof enclosure.

2. Description of the Related Art

Digital multimeters are typically provided with elements such as a rotary switch, a display window, and other elements disposed on the front surface of an enclosure so that various kinds of electrical parameters can be measured by selecting a desired parameter and a proper range via the rotary switch. Inside a digital multimeter are electrical components such as a battery and circuit boards on which integrated circuits and other electrical elements are mounted. To protect them from external dust, moisture, etc., various types of water proof and dust proof techniques are known in the art.

One such conventional digital multimeter is disclosed in U.S. Pat. No. 4,951,834. As shown in FIG. 1 of the above patent, a digital multimeter which has an enclosure with a size that can be carried by one hand, wherein component elements such as a circuit board and a battery are disposed inside the enclosure. On the front surface of the enclosure, there are disposed operating elements such as a rotary switch and press keys used to select a parameter to be measured and its measuring range. Furthermore, a display panel for displaying the measured result is also disposed on the front surface of the enclosure.

The enclosure of the digital multimeter comprises upper and lower enclosures. The sealing at the interface between the connection faces of the upper and lower enclosures is achieved by inserting a gasket or packing between the connection faces and pressing it from both sides. Since the gasket or the packing is placed and pressed between the upper and lower enclosures, the upper and lower enclosures are strongly fastened to each other via a plurality of fastening screws so that they can withstand the opposing force of the gasket. The sealing between the rotary switch and the upper enclosure is also achieved by inserting an elastic sealing material such as a gasket between them and pressing it from both sides. Furthermore, a display window with a transparent glass plate is disposed in the upper enclosure wherein the boundary between the periphery of the transparent glass plate and the upper enclosure is sealed by means of ultrasonic welding.

The above-described conventional sealing mechanism has disadvantages as will be described below. Regarding the sealing mechanism between the upper and lower enclosures, since an elastic sealing material such as a gasket is placed and pressed between these upper and lower enclosures, it is required that the upper and lower enclosures be strongly connected to each other using a plurality of screws so as to ensure that the upper and lower enclosures are not separated by the opposing force of the elastic sealing material. However, this produces a problem that if the number of fasting screws is reduced to reduce production cost, the sealing quality is degraded.

Another problem regarding the sealing mechanism of the rotary switch is that the rotary switch is often fixed to the upper enclosure at some angle with respect to its surface due to inaccuracies in production of the rotary switch or due to positioning error of the rotary switch, which results in an imperfect seal.

Furthermore, the peripheral boundary of the transparent glass plate attached to the surface of the enclosure is not sealed perfectly, thus, water or dust may come into the inside of the enclosure through the boundary.

In view of the above, it is an object of the invention to provide an excellent sealing mechanism for sealing the connection interface between the upper and lower enclosures forming the enclosure of a digital multimeter.

It is another object of the invention to provide a technique for forming a more reliable seal between the enclosure and operating elements such as a rotary switch attached to the enclosure of a digital multimeter.

It is still another object of the invention to provide a technique for forming a more reliable seal between the enclosure and a display window formed in the enclosure of a digital multimeter.

SUMMARY OF THE INVENTION

According to an aspect of the invention, there is provided a digital multimeter including: an enclosure comprising an upper enclosure and a lower enclosure; and measuring circuit elements and other component elements installed in the inside of the enclosure; said digital multimeter being characterized in that an elastic sealing material is disposed between connection faces of said upper enclosure and said lower enclosure such that said upper and lower enclosures are sealed at the interface between said connection faces, wherein the elastic sealing material is pressed and crushed by the upper and lower enclosures in a direction at a slant angle relative to the direction of the thickness of the enclosure.

In this sealing mechanism, it is preferable that the connection face of at least either the upper or lower enclosure has a groove formed at least in a part of a region of the connection face so that the elastic sealing material is prevented from slipping off when the upper and lower enclosures are opened for a maintenance operation or the like.

It is also preferable that there is provided a reinforcing element disposed at least at a part of the connection faces of the upper enclosure and lower enclosure thereby preventing the connection faces from being separated from each other.

In the invention, as described above, the elastic sealing material disposed between the upper and lower enclosure is pressed and crushed in a slant direction. Thus, unlike the conventional technique in which an elastic sealing material is pressed and crushed in the vertical direction (along the thickness of the enclosure), it is possible to reduce the opposing force that tries to separate the upper and lower enclosures from each other. As a result, it is possible to simplify the fastening mechanism for fastening the upper and lower enclosures, which results in a reduction in the production cost while maintaining high-reliability in sealing.

Thus, in the invention, it is possible to employ a simple fastening mechanism using one screw for fastening the upper and lower enclosures as described below.

That is, in this fastening mechanism, the upper and lower enclosures are fastened to each other at first and second fastening positions, wherein the fastening at the first fastening position is achieved using a screw. Furthermore, a fitting projection is formed on either upper enclosure or lower enclosure at the second fastening position and a fitting groove for receiving the fitting projection is formed on the other enclosure so that the fitting projection and the fitting groove are fitted to each other thereby fastening the upper and lower enclosures to each other. Thus, in the invention, it is possible to achieve a highly-reliable fastening mechanism using only one screw without using a plurality of screws.

In this fastening mechanism, it is preferable that the first fastening position is located outside the internal space defined by the elastic sealing material. This arrangement allows elimination of the sealing mechanism at the screw.

It is also preferable that a drain hole is formed at an outer position relative to the elastic sealing material so that water coming into a space between the upper and lower enclosures is drained through the drain hole.

According to another aspect of the invention, there is provided a digital multimeter having a rubber key for switching measurement ranges or the like disposed on the upper enclosure, the digital multimeter being characterized in that a rubber key for switching measurement ranges or the like is fixed through said first fixing opening, wherein a double sealing mechanism is provided at the boundary between the edge face of an opening through which the rubber key is installed and the peripheral side face of the rubber key, wherein the double sealing mechanism includes two or more lines of raised portions formed at proper intervals in the direction of the thickness of the enclosure.

According to still another aspect of the invention, there is provided a digital multimeter having a rotary-switch serving as an operating element disposed on the upper enclosure, the digital multimeter being characterized in that the boundary interface between the edge face of the fixing opening through which the rotary switch is installed and the peripheral side face of the rotary switch extends in the direction along the thickness of the enclosure, and an elastic sealing material is disposed at the boundary interface between the edge face of the fixing opening and the peripheral side face of the rotary switch such that the elastic sealing material is pressed in a direction approximately perpendicular to the thickness of the enclosure. With this sealing mechanism, it is possible to achieve an excellent seal at the boundary between the rotary switch and the enclosure regardless of a production inaccuracy for the rotary switch and any positioning error.

According to still another aspect of the present invention, there is provided a digital multimeter whose upper enclosure includes a display window with a transparent plate through which the display face of a display panel for displaying a measured value or the like can be viewed from the outside, the digital multimeter being characterized in that the upper enclosure is formed together with the transparent plate in an integral fashion by means of the-two-color molding. With this sealing mechanism, it is possible to prevent water or the like from entering the inside of the enclosure through the peripheral boundary of the transparent plate.

In this structure, it is possible to form an input terminal used for connection with an external plug by means of the insert molding at the same time when the upper enclosure is formed. In this case, it is preferable that the input terminal has a flat face portion formed on a part of its peripheral side face having a generally circular shape so that positioning can be easily performed in the insert molding process.

BRIEF DESCRIPTION OF THE DRAWINGS

FIG. 3A is a schematic diagram illustrating an internal structure of the layout of various component elements for the digital multimeter shown in FIG. 1;

FIG. 3B is a cross-sectional view taken along the line 3B—3B of FIG. 3A;

FIG. 3C is a cross-sectional view taken along the line 3C—3C of FIG. 3A;

FIG. 4A is a schematic diagram illustrating the back side of the upper enclosure of the digital multimeter shown in FIG. 1;

FIG. 4B is a cross-sectional view taken along the line 4B—4B of FIG. 4A;

FIG. 4C is a cross-sectional view taken along the line 4C—4C of FIG. 4A;

FIG. 5A is a schematic diagram illustrating a plan view of the lower enclosure of the digital multimeter shown in FIG. 1;

FIG. 5B is a cross-sectional view taken along the line 5B—5B of FIG. 5A;

FIG. 5C is a cross-sectional view taken along the line 5C—5C of FIG. 5A;

FIG. 5D is a cross-sectional view taken along the line 5D—5D of FIG. 5A;

FIG. 5E is a cross-sectional view taken along the line 5E—5E of FIG. 5A;

FIG. 5F is a cross-sectional view taken along the line 5F—5F of FIG. 5A;

DESCRIPTION OF THE PREFERRED EMBODIMENTS

Referring to the accompanying drawings, preferred embodiments of the invention will be described below.

Figure 1:
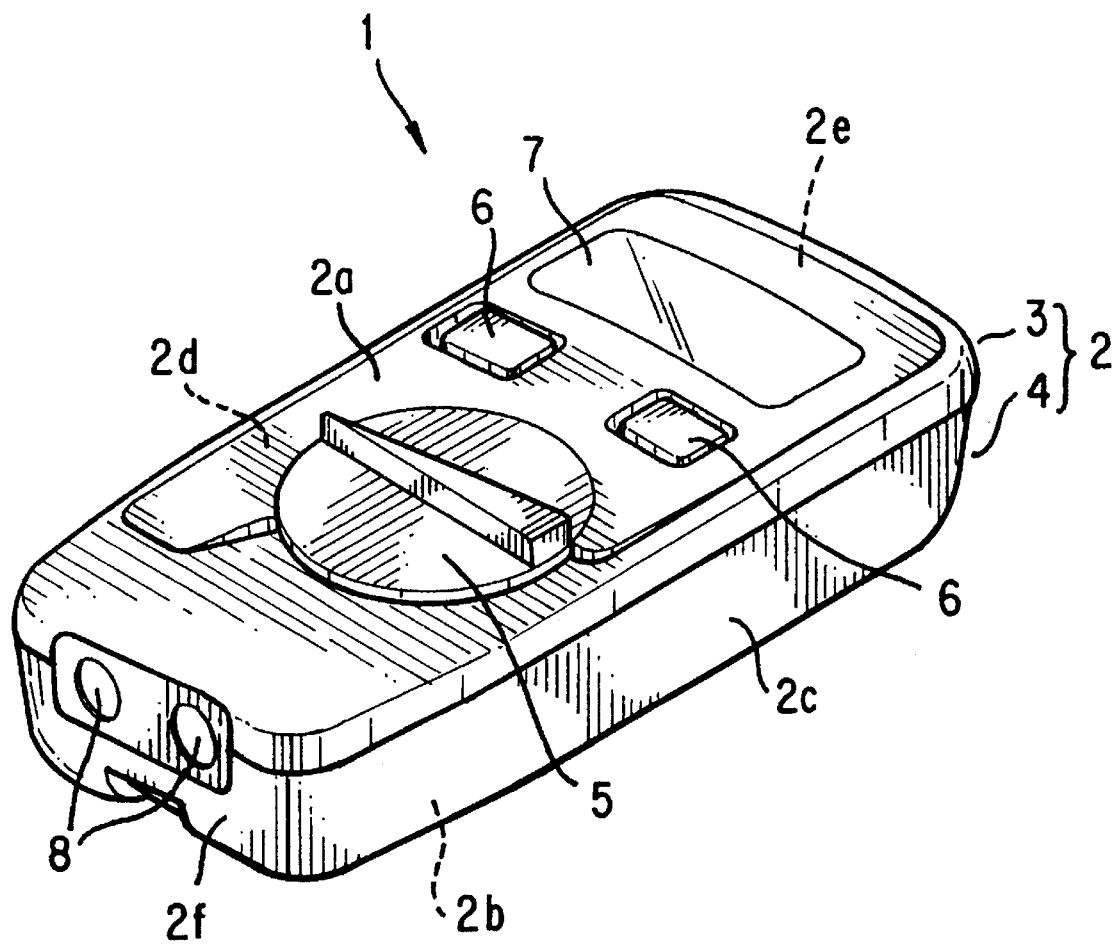
FIG. 1 is a perspective view illustrating an external appearance of a digital multimeter according to one embodiment of the invention.

FIG. 1 illustrates the external appearance of a digital multimeter according to an embodiment of the invention. As shown in this figure, the digital multimeter 1 of the present embodiment has an enclosure 2 with a generally flat and rectangular shape in which various circuit elements are installed. The enclosure 2 comprises an upper enclosure 3 disposed on the front side and a lower enclosure 4 disposed on the back side, wherein the surface of the upper enclosure 3 serves as an operating panel 2a, and the surface of the lower enclosure 4 is the back face 2b of the enclosure. The operating panel 2a and the back face 2b are connected continuously to each other via right and left sides 2c and 2d. Furthermore, these elements are connected continuously to each other via an upper side 2e and a lower side 2f. On the operating panel of the upper enclosure 3 there are disposed operating elements including at least one rubber key 6 for turning on and off the electric power and a knob 5 serving as a rotary switch for selecting an electrical parameter to be measured and its measuring range. A display window 7 made up of a transparent material is disposed in an area of the operating panel near the upper side 2e. Furthermore, a pair of an external terminal insertion holes 8 are disposed on the lower side 2f. The upper side 2e disposed on the opposite location is slightly wider than the lower side 2f.

Figure 2:
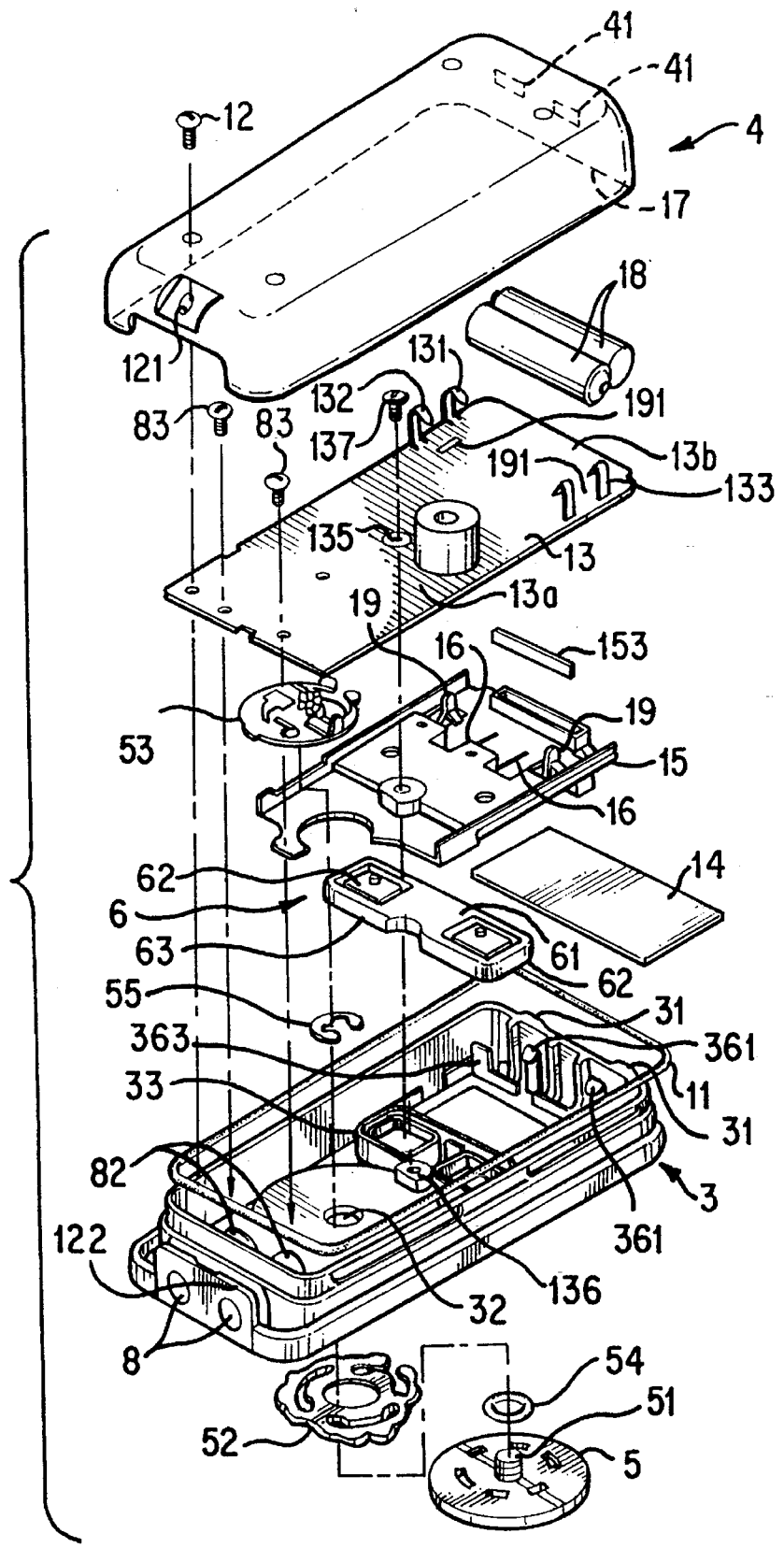
FIG. 2 is an exploded perspective view of the digital multimeter shown in FIG. 1.

FIG. 2 is an exploded perspective view illustrating main component elements of the digital multimeter I according to the present embodiment of the invention. In this figure, the digital multimeter 1 is seen from its back face. FIG. 3A is a cross-sectional view illustrating the layout of the component elements disposed inside the digital multimeter. FIG. 3B is a longitudinal sectional view taken along the section line 3B—3B of FIG. 3A. FIG. 3C is a transverse sectional view taken along the section line 3C—3C of FIG. 3A.

As shown in these figures, The upper enclosure 3 and the lower enclosure 4 composing the enclosure 2 are connected to each other at a connection interface via an elastic sealing material or a packing 11 having a circular cross section disposed between them wherein the connection interface has a certain angle with respect to the thickness direction A of the enclosure 2 thereby forming a sealing mechanism at the connection interface between the upper and lower enclosures. At the lower side face 2f of the enclosure, these upper and lower enclosures 3 and 4 are fastened to each other using one enclosure fastening screw 12. With reference to FIG. 2, at the opposite side 2e, the upper and lower enclosures are fixed to each other via a pair of fitting projections 31, 31 formed on the upper enclosure and a pair of fitting grooves 41, 41 formed on the lower enclosure such that the pair of projections 31, 31 are fitted into the corresponding grooves 41, 41.

A rotary shaft 51 is formed in an integral form in the center of the back side of the knob 5 of the rotary switch wherein the shaft 51 extends toward the inside of the enclosure via a rotary switch fixing opening 32 formed in the upper portion of the enclosure 3. A click rotor 52 is attached to the perimeter of the shaft 51 extending toward the inside of the enclosure so that the rotary position of the rotary switch is defined by the click rotor 52. A rotor 53 is attached to the back face of the rotor 52 in such a manner that a brush contact attached to the rotor 53 can slide on contacts formed on a circuit board 13 thereby making electrical contact with one of the contacts. A ring-shaped elastic sealing material or an O-ring 54 whose cross section has a circular shape is disposed between the shaft 51 of the rotary switch and the opening 32 thereby providing a sealing mechanism at the boundary between the shaft 51 and the opening 32. As for the sealing between the rubber key 6 serving as an operating element and the fixing openings 33 formed in the upper enclosure 3, there is provided a double sealing mechanism that will be described in more detail later. Furthermore, in the present embodiment of the invention, as is shown in FIGS. 3A to 3C, the display window 7 is formed by means of two-color molding in such a manner that the display window 7 is integral with the upper enclosure 3, so as to ensure good sealing at the periphery of the display window 7, as will be described later.

In the inside of the enclosure 2, the circuit board 13 on which circuit elements are mounted is disposed at the center of the thickness of the enclosure along a plane B substantially parallel to the upper and lower enclosures 3 and 4, that is, in the direction perpendicular to the thickness direction A of the enclosure. A liquid crystal display panel 14 is disposed on the back face of the upper enclosure 3 at the position corresponding to the display window 7 and a shielding plate 15 is disposed between the liquid crystal display panel 14 and the circuit board 13. The liquid crystal panel 14 is pressed by a pair of projections 16, 16 formed on the shielding plate 15 so that the liquid crystal display panel 14 is fixed to the back face of the upper enclosure 3. In the lower enclosure 4, there is provided a battery holder 17 at a location opposite to the shielding plate 15 via the circuit board 13. Two batteries 18 are installed in the battery holder 17 in this example. The batteries 18 installed in the battery holder 17 are fixed by battery holding projections 19 formed on the shielding plate 15 wherein the battery holding projections 19 extend through the circuit board 13 into the lower enclosure 4.

Now, each component element relating to the present embodiment will be described below.

Referring mainly to FIGS. 4A–4C, the structure of the upper enclosure 3 will be described below. In the present embodiment of the invention, the upper enclosure 3 comprises: an upper wall 310 defining the operation panel 2a of the enclosure; side wall portions 320 and 330 forming right and left side faces of the enclosure; and side wall portions 340 and 350 forming upper and lower side faces of the enclosure. In the side walls 320, 330 and 340, their base end portions continuing to the upper wall form thick wall portions 321, 331 and 341, the intermediate portions form moderate-thickness wall portions 322, 332 and 342, and the end portions form thin wall portions 323, 333 and 343 such that each side wall has two steps 324, 325, 334, 335, and 344, 345. On the other hand, the lower side wall portion 350 of the enclosure comprises an outer wall 358 and an inner wall 359 each continuing to the right and left side wall portions 320 and 330. The base portion of the inner wall 359 forms a moderate-thickness wall portion (not shown in detail), and the end portion of the inner wall 359 forms a thin wall portion 353 wherein a step 355 is formed between the thin wall portion 353 and the moderate-thickness wall portion.

In the right and left side wall portion 320, 330 and the upper side wall portion 340, raised portions 326, 336, 346 are formed partially on the outer side faces of the thin wall portions 323, 333, 343 thereby forming grooves 327, 337 and 347 between these raised portions and the steps 325, 335, 345 so that the grooves 327, 337, 347 receive the packing 11 thereby preventing the packing 11 from coming off the upper enclosure 3.

FIGS. 5A–5F illustrate the lower enclosure 4. The lower enclosure 4 comprises: a lower wall 410 defining the back face 2b of the enclosure; side wall portions 420 and 430 forming the right and left side faces of the enclosure; and side wall portions 440 and 450 forming the upper and lower side faces of the enclosure. In the side walls 420, 430, 440, 450, their base portions continuing to the upper wall form thick wall portions 421, 431, 441, and their end portions form thin wall portions 423, 433, 443, and 453, wherein sloped steps 425, 435, 445 and 455 are formed between the thin and thick wall portions. The lower side wall portion 450 has an inner wall 446 provided with the sloped step 445 formed at its end portion, wherein the inner wall 446 is separately disposed at an inner position.

Figure 6:
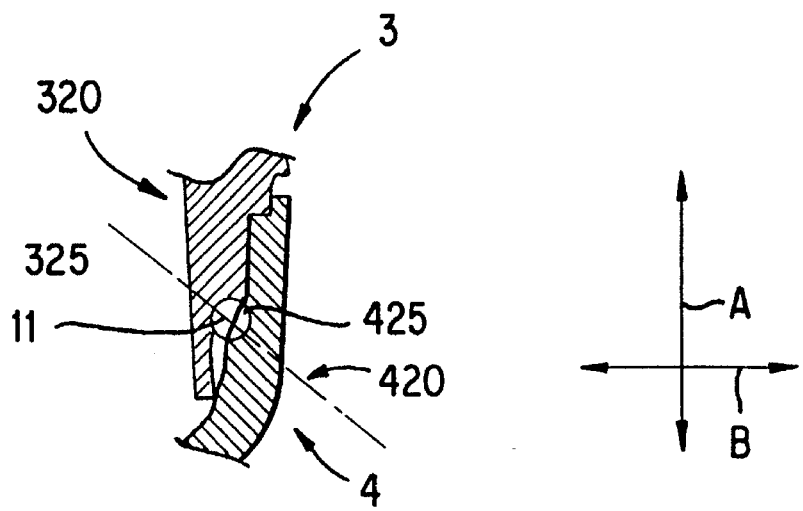
FIG. 6 is an enlarged fragmentary cross-sectional view illustrating a sealing mechanism for sealing a connection interface between the upper and lower enclosures of an embodiment of the digital multimeter shown in FIG. 1.
Figure 7:
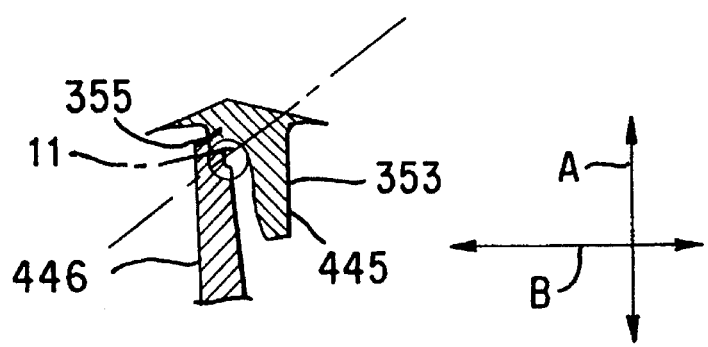
FIG. 7 is a second enlarged fragmentary cross-sectional view illustrating a sealing mechanism for sealing a connection interface between the upper and lower enclosures of the digital multimeter shown in FIG. 1.

On the side wall portion of the upper enclosure 3, as described above, steps 325, 335, 345, 355 are formed in a continuous form at the same height. On the side wall portion of the lower enclosure 4, sloped steps 425, 435, 445, 455 are formed in a continuous fashion at the same height. As described above, the upper enclosure 3 and the lower enclosure 4 are joined together via the packing 11. As shown in FIG. 6 and 7 in an enlarged fashion, the packing 11 is pressed by the steps formed on the upper and lower enclosures and crushed by a proper amount. In the present embodiment of the invention, the steps 425, 435, 445, 455 of the lower enclosure 4 are formed in a sloped fashion as described above. Therefore, the packing 11 is pressed and crushed in a direction at a certain angle to the thickness direction A of the enclosure or the vertical direction. As a result, the opposing or reacting force of the packing 11 acts in the direction at the angle to the vertical direction. Thus, the vertical component of the opposing force (the component in the direction of the thickness of the enclosure) that tries to separate the upper enclosure 3 and the lower enclosure 4 from each other becomes smaller than that in the case where the packing is pressed in the vertical direction. In the present embodiment of the invention, therefore, it is possible to simplify the connecting mechanism between the upper enclosure 3 and the lower enclosure 4 while maintaining a good seal at the connection interface, between the upper enclosure 3 and the lower enclosure 4, that is, maintaining a good seal at the boundary between the steps of both portions of the enclosure.

In this sealing mechanism, the packing 11 is pressed and crushed in a direction at a proper angle to the vertical direction between the upper enclosure 3 and the lower enclosure 4, as described above. As a result, the opposing force of the packing 11 has a horizontal component that tries to expand the side wall portions of the upper enclosure 3 and the lower enclosure 4 in a lateral direction (perpendicular to the thickness of the enclosure). Therefore, there is a possibility that the right and left side wall portions 320, 330, 420, 430 disposed along the length of the enclosure are opened by the above-described force and the packing 11 is not pressed enough. To avoid the above problem, in the present embodiment of the invention as seen in FIG. 5A, two partition walls 461 and 462 are formed in an integral fashion in the lower enclosure 4 in its width direction wherein presser walls 463, 464, and 465, 466 are formed at both ends of each partition wall 461, 462 thereby preventing the side wall portions 320, 330 of the upper enclosure 3 from being opened inward. Furthermore, a reinforcing element 467 extending in a slant direction is formed at the lower end of each presser wall 463–466 so as to increase the rigidity of the presser walls 463–466. The two partition walls 461, 462 also prevent the lower enclosure 4 from being bent.

As described above, the present embodiment of the invention makes it possible to employ a simpler connecting mechanism than conventional techniques. Thus, in the present embodiment of the invention, unlike conventional techniques, the upper enclosure 3 and the lower enclosure 4 are connected to each other in a manner described below without using a plurality of fastening screws.

As shown in FIG. 5F, the lower portion of the inner wall 446 of the lower enclosure 4 has an enclosure fastening screw hole 121 formed at its center position on its outer side. On the other hand, as shown in FIG. 4A, corresponding to the above screw hole 121, the inner wall 359 of the upper enclosure 3 has a screw hole 122, on the edge face of which a female thread is formed, at the center of the outer face of the inner wall 359. An enclosure fastening screw 12 is inserted into the screw holes 121 and 122 from the side of the lower enclosure 4 so that upper and lower enclosures 3 and 4 are fastened to each other.

On the other hand, the opposite side walls 340 and 440 of the upper and lower enclosures 3 and 4 are provided with a pair of fitting mechanisms. That is, fitting projections 31 (see FIG. 2) projecting outwardly are formed at two locations on the outer side face of the thin wall portion 343 of the side wall 340 of the upper enclosure 3. Corresponding to these fitting projections, fitting grooves 41, 41 for receiving the fitting projections 31, 31 are formed on the thick wall portion 441 of the side wall portion 440 of the lower enclosure 4.

Thus, in the present embodiment of the invention, the upper enclosure 3 and the lower enclosure 4 are fastened to each other by one enclosure fastening screw 12 and the pair of fitting mechanisms formed on the opposite side. Since fastening is accomplished by using only one enclosure fastening screw, it is possible to simplify the structure and to reduce the number of component elements. Thus, it also possible to reduce production costs. Furthermore, the enclosures are easy to assemble. Although the connecting mechanism is greatly simplified, it is still possible to have a good seal at the connection interface between the upper and lower enclosures.

In the present embodiment of the invention, the enclosure fastening screw 12 is disposed at an outer location relative to the connection interface between the upper and lower enclosures 3 and 4. That is, the enclosure fastening screw 12 is disposed at an outer location relative to the location where the packing 11 is pressed between the steps 355 and 455. As a result of the employment of the above structure, water or dust cannot reach the location where the circuit board or other elements are disposed via the fastening position. Thus, there is no need to have an additional protection mechanism against water and dust. Therefore, it is also possible to simplify screw fastening structure.

In the present embodiment of the invention, the portion of each of the upper and lower enclosures where these enclosures are fastened by the screw 12 comprises the inner wall at which the packing 11 is placed and the outer wall disposed at an outer position separated from the inner wall. In this structure, although there is no possibility that water or dust can come into the inside of the enclosure via the inner walls, water or dust may come into the space between the outer and inner walls. To avoid the problem above in the present embodiment of the invention, drain holes 471, 471 are formed on both sides of the screw hole 121 of the lower enclosure, as shown in FIGS. 3A and 3B. The water coming into the space between the outer and inner walls can be drained through these drain holes 471 thereby preventing the water from accumulating in the space.

As described above, the knob 5 of the rotary switch serving as one of the operating elements is disposed on the surface of the upper enclosure 3. A rotary shaft 51 is formed in an integral fashion in the center of the back face of the knob 5 of the rotary switch. The shaft 51 extends through the rotary switch fixing opening 32 formed in the upper enclosure and further into the inside of the enclosure wherein there is provided a fastening ring 55 on the back side of the upper enclosure 3 so that the shaft 51 is prevented from slipping off. A click rotor 52 that defines the rotary position of the rotary switch is fixed to the periphery of the shaft 51 extending inside the enclosure. A rotor 53 is attached to the back face of the click rotor 52 such that a brush contact attached to the rotor 53 can slide on contacts formed on the circuit board 13 thereby making electrical contact with one of these contacts. A ring-shaped elastic sealing material or an O-ring 54 whose cross section has a circular shape is disposed between the shaft 51 of the rotary switch and the opening 32 thereby providing a sealing mechanism at the boundary between the shaft 51 and the opening 32.

In the present embodiment of the invention as seen in FIG. 2 and elsewhere, an O-ring fixing groove 51b is formed on the peripheral surface 51a of the rotary shaft 51 facing the edge face 32a of the fixing opening 32 so that the O-ring 54 is fitted in the O-ring fixing groove 51b. Thus, the O-ring 54 is disposed and pressed between the peripheral surface 51a of the rotary shaft 51 and the edge face 32a of the opening formed in the enclosure. Using conventional techniques, this portion is sealed by an O-ring disposed between the back face of the knob 5 of the rotary switch and the outer surface of the upper enclosure 3 thereby pressing the O-ring in the vertical direction (along the thickness A of the enclosure). Where the O-ring is pressed in vertical directions, the knob 5 may have an angle relative to the surface of the upper enclosure 3 due to an inaccuracy in the production of the knob 5 or due to a positioning error of the knob 5, which results in insufficient pressing against the O-ring to achieve a good seal. In contrast, in the present embodiment of the invention, since the O-ring is pressed in the horizontal direction (B), it is possible to always achieve a good seal without such a problem.

A double sealing mechanism is provided as the sealant between the rubber key 6 serving as an operating element and the fixing openings 33 formed in the upper enclosure 3. The rubber key 6 comprises: a rectangular base portion 61; a pair of main rubber key portions 62, 62 formed on the base portion 61; and a peripheral wall 63 surrounding the main rubber key portions 62, 62. The upper faces of the main rubber key portions 62, 62 are exposed to the outside via fixing openings 33, 33 formed in the upper enclosure 3. On the back face of the upper enclosure 3 there are provided peripheral grooves 33a surrounding the fixing openings 33, 33 such that the peripheral walls 63, 63 are fitted into the peripheral grooves 33a from the back side of the upper enclosure. The rubber key 6 is attached to the upper enclosure 3 by inserting the peripheral walls 63 into the peripheral grooves 33a surrounding the rubber key 6. The shielding plate 15 presses the rubber key 6 against the upper enclosure 3 thereby fixing the rubber key 6.

Figure 8:
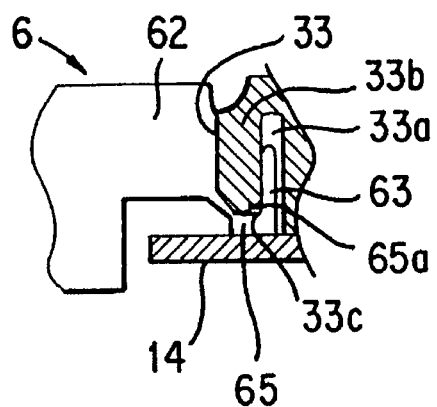
FIG. 8 is a third enlarged fragmentary cross-sectional view illustrating the sealing mechanism for sealing the peripheral boundary of a rubber key of the digital multimeter shown in FIG. 1.

As shown in FIG. 8 in an enlarged fashion, an uneven surface structure 33c is formed at the end portion of a peripheral wall 33b of each peripheral groove 33a surrounding the opening 33. The uneven surface 33c is in contact with the surface of a connecting portion 65 between the main rubber key portion 62 and the peripheral wall 63 of the rubber key. The connecting portion 65 has an uneven surface structure 65a corresponding to the uneven surface structure 33c formed on the upper enclosure. These uneven surfaces 33c and 65a are pressed against each other by the pressing force of the shielding plate 15 acting from the back side of the upper enclosure.

In the present embodiment of the invention, as described above, the sealing between the rubber key 6 and the fixing opening is achieved by the double sealing mechanism comprising the uneven surface structures 33c and 65a. This allows for a better seal at this portion over conventional techniques, and thus prevents water or dust from entering the enclosure via this sealing portion.

In the present embodiment of the invention, the above-described upper enclosure 3 and the lower enclosure 4 are formed by molding a synthetic resin material into a desired shape. The upper enclosure 3 is formed using the two-color molding technique so that the transparent display window 7 is also formed from a different material in an integral fashion. That is, the upper enclosure 3 is made up of an ABS resin, and the transparent display window 7 is made up of a polycarbonate resin. Perfect sealing can be achieved at the boundary between these portions made up of different materials because these portions are formed in an integral fashion by means of the two-color molding. In contrast, in conventional techniques, a transparent glass plate for the transparent display window 7 is separately formed, and welded to the opening formed in the upper enclosure 3 by means of ultrasonic welding or the like. The monolithically molded enclosure according to the invention provides a more reliable seal than an enclosure made by welding separate elements.

In production of the upper enclosure 3 by means of a two-color molding technique according to the present embodiment of the invention, the transparent display window 7 and the side wall portions 320, 330, 340, 350 are formed using a polycarbonate resin. In FIGS. 4B and 4C, the side wall portions inside the broken lines are formed of a polycarbonate resin, and the portion outside the broken lines is formed of an ABS resin. In this way according to the present embodiment of the invention, the thick portions of the side wall portions 320–350 allow the upper and lower enclosures to get into sufficient engagement with each other, and also produce an enough distance to electrically isolate the internal circuits from a human body for safety.

In the present embodiment of the invention, when the upper enclosure 3 is formed by a two-color molding technique, the input terminals are also formed by insert molding. External terminal insertion holes 8, 8 are formed in the lower side face 2f of the enclosure, and input terminals 81 are disposed at a location on the inner side of the lower side face 2f so that the input terminals 81 can connect the external terminals to the electrical circuits mounted on the circuit board 13 disposed inside the enclosure.

Figure 9A:
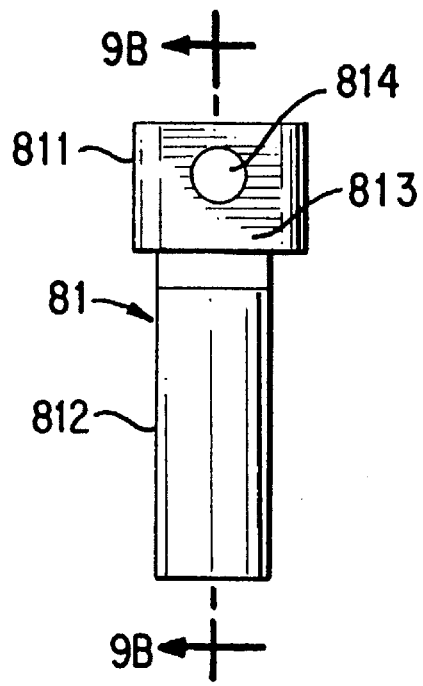
FIG. 9A is a schematic diagram illustrating a plan view of an input terminal of the digital multimeter shown in FIG. 1.
Figure 9B:
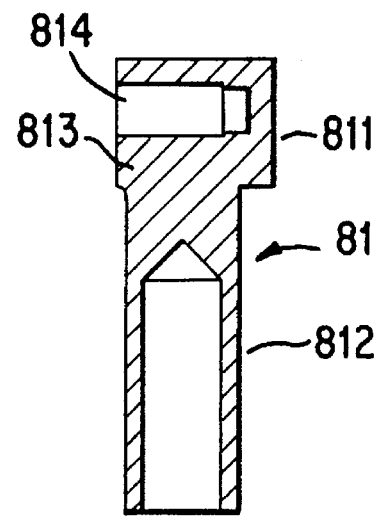
FIG. 9B is a cross-sectional view taken along the line 9B—9B of FIG. 9A.
Figure 9C:
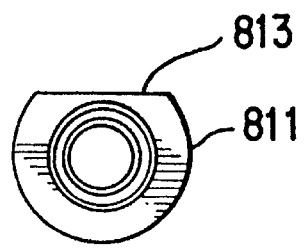
FIG. 9C is a side view illustrating a head of the input terminal shown in FIG. 9A.

As shown in FIGS. 9A–9C, each input terminal 81 comprises a head 811 formed in a cylindrical shape and a cylinder leg 812 having a smaller diameter connected continuously to the head 811 wherein a hole is formed at the end of the leg 812 so that the external terminal can be inserted into it. The head 811 has a flat face portion 813 formed on a part of its peripheral side face wherein a screw hole 814 is formed in the center of the flat face portion 813 such that the screw hole 814 extends along a diameter of the head. The input terminals 81 having the above-described structure are formed by means of the insert molding into two input terminal fitting portions 82 each having an external terminal insertion holes 8 formed in the upper enclosure 3.

As shown in FIG. 3B, the input terminals 81 are attached such that the flat face portion 813 formed on the head 811 of each input terminal faces the circuit board 13. A screw 83 is inserted into each screw hole 814 from the side of the circuit board 13 so that the flat face portion 813 comes into close contact with an input terminal connection element (not shown) formed on the surface of the circuit board 13.

In the input terminal 81 according to the present embodiment of the invention, a flat face portion 813 is formed on a part of the circular peripheral face of the head 811, as described above. This flat face portion makes it easier to produce and assemble an input terminal and associated elements. That is, in the insert molding process, the flat face portion can be used as a reference face for positioning the input terminal. Furthermore, the input terminal can be easily connected to the circuit board 13 such that the flat face portion 813 comes in close contact with the circuit board 13.

Now, referring to FIGS. 2 and 3A–3C, the internal structure of the enclosure 2 comprising the upper enclosure 3 and lower enclosure 4 will be explained. In the inside of enclosure 2, as described earlier, the circuit board 13 on which circuit elements are mounted is disposed at the center of the thickness A of the enclosure 2 along a plane B substantially parallel to the upper and lower enclosures 3 and 4, that is, in the direction perpendicular to the thickness direction A of the enclosure 2. A liquid crystal display panel 14 is disposed on the back face of the upper enclosure 3 at the position corresponding to the display window 7 and a shielding plate 15 is disposed between the liquid crystal display panel 14 and the circuit board 13. In the lower enclosure 4, there is provided a battery holder 17 at a location opposite to the shielding plate 15 via the circuit board 13, wherein two batteries 18 are installed in the battery holder 17 in this example.

In the circuit board 13, a circuit pattern is formed on the surface 13a of the circuit board facing toward the upper enclosure 3. Circuit elements such as integrated circuit chips are mounted on it. The upper and lower portions are shielded from each other by the circuit board 13 and the shielding plate 15. On the opposite surface 13b of the circuit board, there are provided two pairs of connecting terminal plates 131, 132, 133, 134 at positions corresponding to the battery holder 17 wherein the connecting terminal plates project toward the battery holder. The circuit board 13 is fixed to the upper enclosure 3 via the two screws 83, 83 which are also used to fasten the above-described input terminal 81. A screw hole 135 is formed in the center of the circuit board 13. A screw hole 136 is formed in the upper enclosure 3 at the position corresponding to the screw hole 135. The circuit board 13 is also fastened to the upper enclosure 3 using a fastening screw 137 via the screw hole 136. Furthermore, a pair of fitting projections 361, 361 are formed on the inner wall face of the upper side wall 340 of the upper enclosure 3. Holder walls 363 and 364 are formed adjacent to the pair of fitting projections 361, 361 such that the holder walls project inward along the thickness direction A from the upper wall 310 of the upper enclosure 3 (refer to FIGS. 4A–C). One end of the circuit board 13 is held between the fitting projections and the holder walls.

Figure 10B:
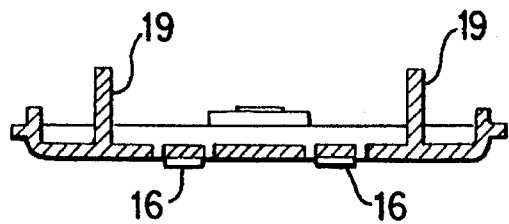
FIG. 10B is a cross-sectional view taken along the line 10B—10B of FIG. 10A.
Figure 10A:
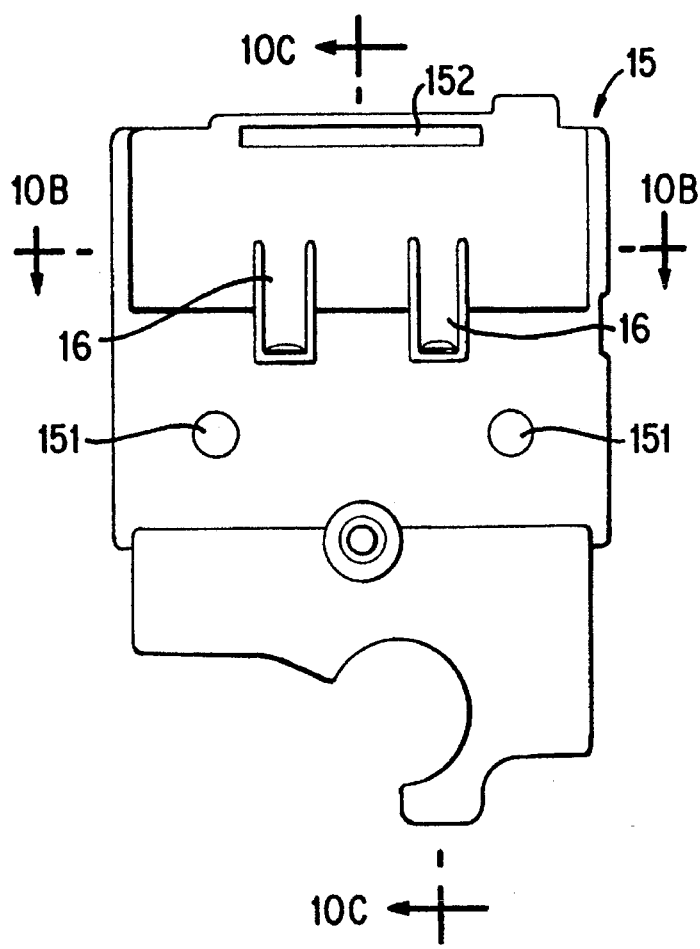
FIG. 10A is a schematic diagram illustrating a plan view of a shielding plate of the digital multimeter shown in FIG. 1.
Figure 10C:
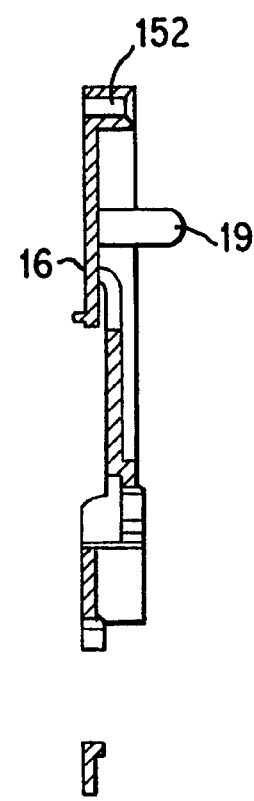
FIG. 10C is a cross-sectional view taken along the line 10C—10C of FIG. 10A.
Figure 6:
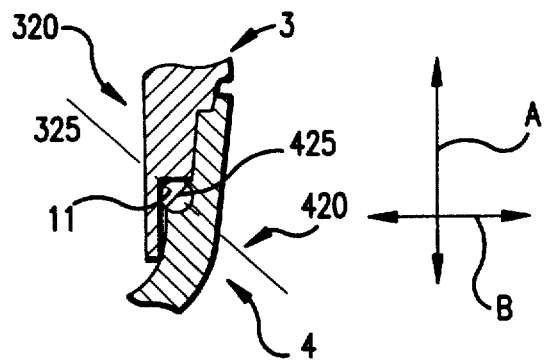
Figure 7:
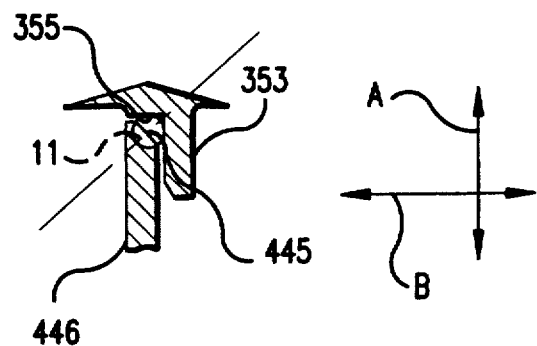
Figure 8:
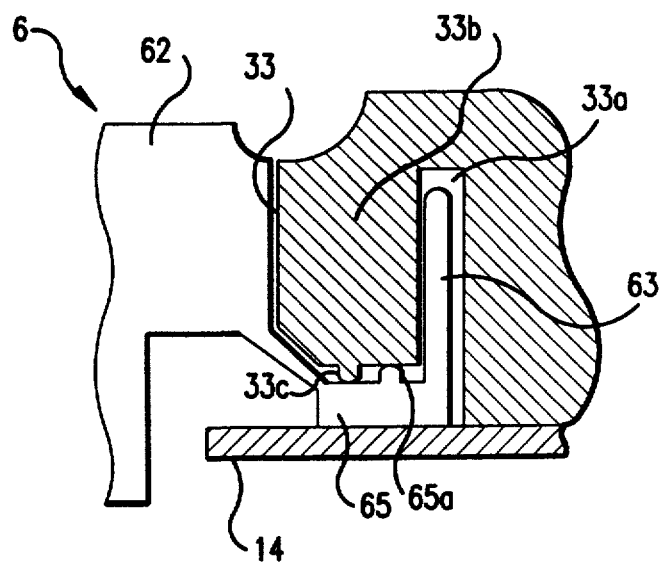

As shown in FIGS. 10A–C, on the shielding plate 15 disposed between the circuit board 13 and the upper enclosure 3, a pair of elastic projections 16, 16 are formed at locations facing the liquid crystal panel 14. Each elastic projection 16 is formed at an end of a square cut-out portion formed in the shielding plate 15 such that the elastic projection 16 extends toward the liquid crystal panel 14. Thus, when the circuit board 13 is fastened via the shielding plate 15 to the upper enclosure 3 using the three screws 83, 83, 137, the liquid crystal panel 14 is elastically pressed by the ends of the elastic projections 16, 16 against the transparent display window 7 of the upper enclosure 3 and fixed there.

In the present embodiment of the invention, since the liquid crystal panel 14 is fixed elastically by the pressure of the elastic projections as described above, even if the digital multimeter 1 falls down or a similar mechanical shock is applied to the digital multimeter, the elastic projections 16, 16 holding the liquid crystal panel 14 absorb the mechanical shock, thereby protecting the liquid crystal panel 14 from the direct and great mechanical shock. In this way according to the present embodiment of the invention, elastic projections are effectively used to construct a fastening mechanism of the liquid crystal panel having excellent shock-absorbing performance.

Furthermore, in the present embodiment of the invention, the shielding plate 15 has a pair of battery holding projections 19, 19 formed at positions corresponding to the battery holder 17 disposed in the lower enclosure 4 wherein the pair of battery holding projections extend in the vertical direction toward the lower enclosure 4. These projections 19, 19 extend via through-holes 191, 191 formed in the circuit board 13 toward the battery holder 17. As shown in FIG. 3B, these projections 19 are designed to have a proper length so that the end of each projection 19 just reaches the upper portion of the peripheral side face of each of two batteries 18 installed in the battery holder 17.

Now, the battery holder 17 disposed in the lower enclosure 4 will be described in more detail. As shown in FIGS. 5A–5F, the battery holder 17 comprises partition walls 171–176 formed at six locations on the lower wall 410 of the lower enclosure 4 such that these partition walls prevent the two batteries 18, 18 from moving in the direction along the plane B. Furthermore, there are provided three slipping-off protection plates 177, 178, 179 in a curved shape corresponding to the peripheral side face of the battery thereby preventing the batteries from slipping off in the thickness direction A. However, the distance between the two slipping-off protection plates 177, 178 and the slipping-off protection plate 179 disposed at the opposite location is set to a value such that batteries can be mounted and removed through the space between these slipping-off protection plates. Therefore, there is a possibility that the batteries 18 may leave the battery holder 17 when the digital multimeter is dropped or a similar mechanical shock is applied to the digital multimeter, which may damage the Circuit board 13 or some other elements.

In practice, the above problem does not occur in the present embodiment of the invention, because there are provided a pair of battery holding projections 19, 19 on the shielding plate 15 so that two batteries installed in the battery holder 17 are pressed toward the lower enclosure 4 by the pair of projections and held there, as described earlier. Thus, these projections 19 prevent the batteries from falling or moving out even when a mechanical shock is applied to the digital multimeter. Furthermore, unlike conventional techniques, the batteries are installed on the side opposite to where the circuit board 13 is disposed, thereby achieving a high shock resistance digital multimeter.

In the present embodiment of the invention, the shielding plate 15 is fastened by the screw 137 to the upper enclosure 3 such that the electrical shielding for the circuit board is achieved by the screw.

Of the circuit elements mounted on the circuit board 13, heavy elements or elements that may come off due to mechanical shock are fixed by a mechanism according to the invention.

In the present embodiment of the invention, as can be understood best from FIG. 3C, there is provided a presser foot 155 on the surface of the shielding plate 15 facing toward the circuit board 13 thereby preventing a crystal resonator element 138 soldered to the circuit board from separating from the circuit board.

Furthermore, in the present embodiment of the invention, an electric fuse is disposed on the input terminal fitting portion 82 as shown in FIGS. 3A and 3B. A pair of projections 481, 481 are disposed in the lower enclosure 4 so as to prevent the fuse 139 from moving in the lateral direction (perpendicular to the thickness direction A) due to a mechanical shock.

A pair of holes 151, 151 are formed in the shielding plate 15 so that the contact points of the rubber keys can get in contact with the contact points formed on the circuit board 13 via the holes 151, 151. Furthermore, an opening 152 with a long rectangular shape is formed at one end of the shielding plate 15 and a rectangular conductive rubber 153 is disposed in the opening 152 thereby providing electrical connections between the circuits on the circuit board 14 and the liquid crystal panel 14.

As described above, in the digital multimeter according to the invention, an enclosure is formed by combining an upper enclosure and a lower enclosure via an elastic sealing material wherein the elastic sealing material disposed between the upper and lower enclosures is pressed and crushed in a direction at a certain slant angle relative to the direction of the thickness of the enclosure thereby achieving a sealing at a connection interface. This structure reduces the opposing force of the elastic sealing material that tries to separate the upper enclosure and the lower enclosure from each other. Thus, it is possible to simplify the connecting mechanism for connecting the upper and lower enclosures while maintaining an excellent sealing at the connection interface. Furthermore, a slipping-off protection groove is formed at least at either the upper or lower enclosure at the connection interface between them so that the elastic sealing material does not slip off easily when the upper and lower enclosures are opened for maintenance operation. Moreover, a reinforcing element is disposed at least at a part of the connection interface between the upper enclosure and the lower enclosure thereby preventing the upper and lower enclosure from being separated from each other, and thus the elastic sealing material is pressed with sufficient force to maintain excellent sealing between the upper and lower enclosures.

In the invention, since the elastic sealing material is pressed in a slant direction as described above, it is possible to employ a fastening mechanism in which the upper and lower enclosures are fastened to each other at first and second fastening positions. Fastening at the first fastening position is achieved using a screw. A fitting projection is formed on either an upper or lower enclosure at a second fastening position. A fitting groove for receiving a fitting projection is formed on the other enclosure so that the fitting projection and the fitting groove are fitted to each other, thereby fastening the upper and lower enclosures to each other.

In this fastening mechanism, it is preferable that the first fastening position is located outside the internal space defined by the elastic sealing material. This arrangement allows elimination of a sealing mechanism at the screw. It is also preferable that a drain hole is formed at an outer position relative to the elastic sealing material so that water coming into a space between the upper and lower enclosures is drained easily through the drain hole.

Furthermore, in a digital multimeter, according to the invention, having a rubber key for switching measurement ranges or the like disposed on an upper enclosure, a double sealing mechanism is provided at the boundary between the edge face of an opening through which the rubber key is installed and the peripheral side face of the rubber key. The double sealing mechanism includes two or more lines of raised portions formed at proper intervals in the direction of the thickness of the enclosure. In a digital multimeter, according to the invention, having a rotary switch serving as an operating element disposed on the upper enclosure, the boundary interface between the edge face of the second fixing opening through which the rotary switch is installed and the peripheral side face of the rotary switch extends in the direction along the thickness of the enclosure. An elastic sealing material is disposed at the boundary interface between the edge face of the fixing opening and the peripheral side face of the rotary switch such that the elastic sealing material is pressed in a direction approximately perpendicular to the thickness of the enclosure. With this sealing mechanism, it is possible to achieve an excellent seal at the boundary between the rotary switch and the enclosure regardless of the production inaccuracy of the rotary switch and positioning error.

Furthermore, in a digital multimeter, according to the invention, whose upper enclosure includes a display window with a transparent plate through which the display face of a display panel for displaying a measured value or the like can be viewed from the outside, the upper enclosure is formed together with the transparent plate in an integral fashion by means of a two-color molding technique. With this sealing mechanism, it is possible to prevent water or the like from entering into the enclosure through the peripheral boundary of the transparent plate. In this structure, it is possible to easily form an input terminal used for connection with an external plug by means of an insert molding technique at the same time when the upper enclosure is formed. In this case, it is preferable that the input terminal has a flat face portion formed on a part of its peripheral side face having a generally circular shape so that positioning can be easily performed in the insert molding process.

While advantageous embodiments have been chosen to illustrate the invention, it will be understood by those skilled in the art that various changes and modifications can be made therein, without departing from the scope of the invention as defined in the appended claims.

What is claimed is:

1. A digital multimeter comprising:

an enclosure comprising an upper enclosure selectively fastened to a lower enclosure, the upper and lower enclosures each having a surface and a connection face extending from the surface, the connection face having one end connected to the surface and another end defining a free end;

circuit elements and component elements installed inside the enclosure for performing digital multimeter functions;

an elastic sealing material disposed between the connection faces of the upper enclosure and the lower enclosure at a location intermediate the one end and the free end of each connection face, such that the upper and lower enclosures are sealed at an interface between the connection faces, whereby the connection face of each of the upper enclosure and the lower enclosure are configured to subject the elastic sealing material to pressing and crushing forces in a direction at a slant angle relative to a direction of a thickness of the enclosure so that the upper and lower enclosures are selectively fastened to each other at a portion of the interface between their connection faces less than the entire interface between their connection faces.

2. The digital multimeter according to claim 1, wherein, of the connection faces of said upper enclosure and said lower enclosure, at least the connection face of the upper enclosure has a groove formed at least in a part of a region of said connection face, for preventing said elastic sealing material from slipping off.

3. The digital multimeter according to claim 1, wherein at least a part of the connection face of each of said upper enclosure and said lower enclosure includes a reinforcing element for preventing said connection faces from being separated from each other.

4. The digital multimeter according to claim 1, wherein said upper enclosure and said lower enclosure are fastened to each other at first and second fastening positions, and further wherein:

said fastening at said first fastening position is achieved using a screw; and a fitting projection is formed on one of said upper enclosure and said lower enclosure at said second fastening position and a fitting groove for receiving said fitting projection is formed on an other of said upper and said lower enclosure so that said fitting projection and said fitting groove are fitted to each other for fastening said upper enclosure and said lower enclosure to each other at said second fastening position.

5. The digital multimeter according to claim 4, wherein said first fastening position is located outside an internal space defined by said elastic sealing material.

6. The digital multimeter according to claim 1, wherein a drain hole is formed in one of said upper enclosure and said lower enclosures so that water coming into a space between said upper and lower enclosures is drained through said drain hole.

7. The digital multimeter according to claim 1, wherein a fixing opening is formed in said upper enclosure so that a key is fixed through said fixing opening, and further Wherein a double sealing mechanism is provided at a boundary between an edge face of said fixing opening and a peripheral side face of said key, said double sealing mechanism comprising two or more lines of raised portions formed at proper intervals in a direction of a thickness of said enclosure.

8. The digital multimeter according to claim 1, wherein a fixing opening is formed in said upper enclosure so that a rotary switch is fixed through said fixing opening, wherein the connection interface between an edge face of said fixing opening and a peripheral side face of said rotary switch extends in the direction along the thickness of said enclosure, and an elastic sealing material is disposed at said connection interface between the edge face of said fixing opening and the peripheral side face of said rotary switch such that said elastic sealing material is pressed in a direction approximately perpendicular to the direction of thickness of said enclosure.

9. The digital multimeter according to claim 1, wherein said upper enclosure includes a display window with a transparent plate through which a display face of a display panel can be viewed from the outside and said upper enclosure is formed together with said transparent plate in an integral fashion by a two-color molding technique.

10. The digital multimeter according to claim 9, wherein an input terminal used for connection with an external terminal is attached to said upper enclosure, said input terminal being fixed to said upper enclosure by an insert molding technique.

11. The digital multimeter according to claim 10, wherein said input terminal has a peripheral side face having a generally circular shape, wherein a flat face portion is formed on a part of said peripheral side face.

* * * * *

UNITED STATES PATENT AND TRADEMARK OFFICE
CERTIFICATE OF CORRECTION

PATENT NO. : 5,621,311  
DATED : Apr. 15, 1997  
INVENTOR(S) : Manabu Kamiya

It is certified that error appears in the above-identified patent and that said Letters Patent is hereby corrected as shown below:

The drawing sheet, consisting of Figs. 6, 7 and 8, should be deleted to be replaced with the drawing sheet consisting of Figs. 6, 7 and 8, as shown on the attached page.

Signed and Sealed this

Nineteenth Day of August, 1997

BRUCE LEHMAN

Attest:

Attesting Officer

Commissioner of Patents and Trademarks